Figure 1:
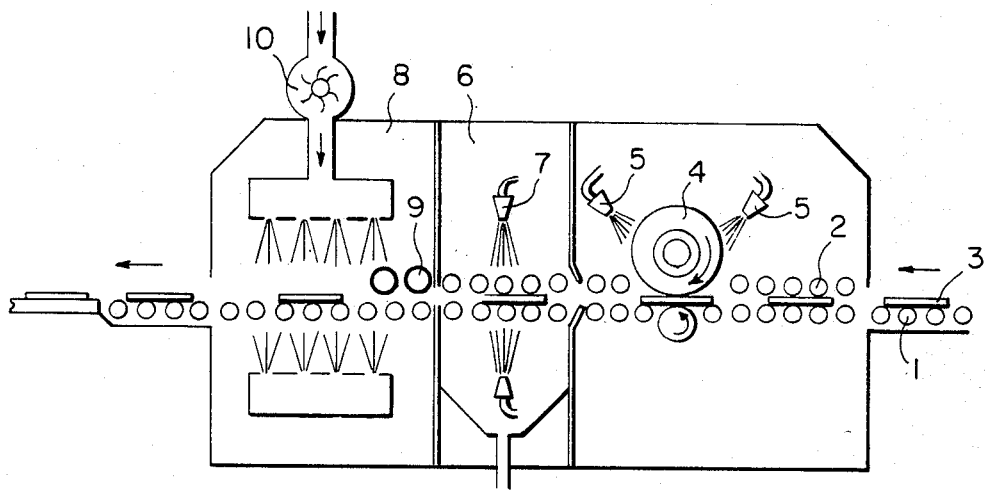

United States Patent [19]

Buchner et al.

[11] Patent Number: 4,587,771
[45] Date of Patent: May 13, 1986

[54] PROCESS FOR THE BACKSIDE-GETTERING SURFACE TREATMENT OF SEMICONDUCTOR WAFERS

[75] Inventors: Alfred Buchner, Pischelsdorf, Austria; Franz Kuhn-Kuhnenfeld, Emmerting; Walter Auer, Burghausen, both of Fed. Rep. of Germany

[73] Assignee: Wacker-Chemitronic Gesellschaft fur Elektronik-Grundstoffe mbH, Burghausen, Fed. Rep. of Germany

[21] Appl. No.: 421,452

[22] Filed: Sep. 22, 1982

[30] Foreign Application Priority Data

Dec. 10, 1981 [DE] Fed. Rep. of Germany ....... 3148957

[51] Int. Cl.$^4$ ............................................. B24B 1/00
[52] U.S. Cl. ........................ 51/281 SF; 156/DIG. 66
[58] Field of Search ...................... 156/600, DIG. 66; 148/1.5, DIG. 24; 51/281 SF

[56] References Cited

U.S. PATENT DOCUMENTS 3,905,162 10/1975 Lawrence et al. ............... 51/281
4,042,419 8/1977 Heinke et al. ................ 148/1.5
4,276,114 6/1981 Takano et al. ............. 156/DIG. 66

FOREIGN PATENT DOCUMENTS 2927220 1/1981 Fed. Rep. of Germany .

OTHER PUBLICATIONS

Copy of U.S. patent application Ser. No. 162,236/Lampert et al.

Primary Examiner—Hiram H. Bernstein
Attorney, Agent, or Firm—Collard, Roe & Galgano

[57] ABSTRACT

Point defects or impurities, which are detrimental to the quality of electronic components, can be eliminated by means of rearsurface damage, which induces dislocations and/or stacking faults, by means of mechanical stress to the semiconductor wafers used in the manufacture of those components. For this purpose, the semiconductor wafers are brought into contact, before polishing, oxidation and thermal treatment, with moving carrier bodies covered with an elastic carrier medium having abrasive grain bonded to it, which creates the desired mechanical stress by forming a large number of very fine scratches and fissures in the surface of the semiconductor wafers.

13 Claims, 4 Drawing Figures

|←—————→|
0.1mm

PROCESS FOR THE BACKSIDE-GETTERING SURFACE TREATMENT OF SEMICONDUCTOR WAFERS

The present invention relates to a process and apparatus for the backside-gettering surface treatment of semiconductor wafers by means of mechanical stress.

In the manufacture of electronic components from semiconductor wafers, the point defects and impurities present in the wafers can have various adverse effects. They are, for example, the cause of increased leakage currents at barrier layers and capacitors in integrated circuits.

Such point defects, point defect clusters and impurities can, however, be removed by various processes from the semiconductor wafers intended for the manufacture of electronic components. This operation is usually termed "gettering" or, more precisely, "back-gettering", since the defects are removed via the rear of the wafer, in order to keep the front of the wafer free of defects.

According to U.S. Pat. No. 4,042,419, the semiconductor wafers are, for example, provided on one side with a mechanical stress field and are subsequently subjected to thermal treatment. In this manner, the point defects, which are mobile at elevated temperatures, are drawn out of the semiconductor wafer under the gettering action of the one-sided mechanical stress field. Such a one-sided mechanical stress field is produced either by super-saturating the surface region of the crystal lattice with foreign atoms of a different size from the atoms of the semiconductor lattice, or by means of specific damage to the surface produced by brief grinding with a suitable lapping abrasive. In this process, however, important geometric parameters of the semiconductor wafers, such as its thickness, flatness or degree of taper, can be altered.

Sand blasting or systematic uniform scratching of one side of the wafer, for example, with the aid of a style of a material harder than the semiconductor material, can also produce one-sided surface damage having a gettering effect, as described in U.S. Pat. No. 3,905,162. The resulting damage to the rear of the wafer is, however, often sufficiently so great that it can break through to the front of the wafer during the subsequent operations. Furthermore, the process according to U.S. Pat. No. 3,905,162 is relatively protracted as a result of the contact surface of the style being small in comparison with the surface of the wafer, and thus it permits only low throughput rates.

Finally, it is possible also, according to German Offenlegungschrift 29 27 220, to immerse the semiconductor wafers in a so-called "fluid bath" of abrasive grains which are agitated by means of a flowing carrier medium. This treatment permits a high throughput, but it enables only the formation of stacking faults to be induced in the semiconductor wafers, and those faults are not stable in processes carried out above 1200° C., such as are essential for the manufacture of certain components.

The object of the invention is therefore to provide a process and apparatus which permits the back-gettering surface treatment of semiconductor wafers by means of mechanical stress to be carried out in a controlled and uniform manner, and at high throughput rates, while retaining the geometry of the wafers.

This object is achieved by means of a process which is characterized in that the semiconductor wafers are brought into contact with one or more moving carrier bodies, the surface of which is provided with an elastic carrier medium to which an abrasive grain is bonded which creates the mechanical stress.

This treatment produces, on the treated surface-side of the semiconductor wafer, a large number of very fine microscratches and fissures, which, depending on the degree of mechanical stress, can have a depth of from less than 0.1 $\mu$m up to approximately 1–10 $\mu$m. Such microscratches and fissures are the cause of mechanical stress in the surface region of the semiconductor wafer and already have a gettering effect themselves. In addition, they have the ability to induce, during a subsequent oxidation or thermal treatment of the semiconductor wafer carried out, for example, for the purpose of manufacturing electronic components, stacking faults and dislocations which, in turn, have an extremely strong gettering effect on point defects of all types.

In general, substances which are as hard as or harder than the semiconductor wafers to be processed are suitable for use as the abrasive grain. In the case of silicon wafers, therefore, suitable substances are, for example, silicon, quartz, diamond or zirconium dioxide, as well as hard materials, such as, for example, tungsten carbide, boron carbide or titanium carbide, and, especially, silicon carbide or aluminum oxide.

The choice of the grain size of the abrasive grain depends mainly on the nature of the desired surface damage. As a rule, the use of a fine abrasive grain promotes surface treatment that induces stacking faults, while coarse abrasive grain is preferred for the production of dislocations in the surface region. Advantageous grain sizes are, especially, those within the range from 3 to 250 $\mu$m.

Suitable carrier media are, in general, elastic substances, which are to be understood as including resilient expansible and compressible materials having the tendency to reverse the deformations occuring under the action of deforming forces. Materials having a Shore A hardness of up to 90 have proved particularly suitable. Elastic substances within the meaning of the invention can be, for example, non-woven or felt-like materials, as well as rubber or brushes based on plastics or metal materials, the use of other elastic substances, of course, not being excluded.

The particular abrasive grain chosen can be bonded to the elastic carrier medium in various ways. If, for example, a non-woven material is used as the carrier medium, the abrasive grain is advantageously fixed thereto by means of a suitable adhesive. If, on the other hand, substances such as, for example, rubber, are used, it is advantageous to embed the abrasive grain in the carrier medium itself, for example, therefore, in the rubber, it, of course, being necessary to ensure that there will be sufficient contact between the abrasive grain and the semiconductor wafer to be processed.

The carrier body, to the surface of which the elastic carrier medium containing the abrasive grain bonded to it is applied, can be of various shapes. Thus, in principle, for example, in the case of the arrangements known for grinding, lapping or polishing technology, grinding, lapping or polishing wheels provided with a suitable carrier medium can be used. Particularly good results are obtained, however, using cylindrical carrier bodies.

Other objects and features of the present invention will become apparent from the following detailed description considered in connection with the accompanying drawings, which disclose one embodiment of the invention. It is to be understood that the drawings are to be used for the purposes of illustration only, and not as a definition of the limits of the invention.

IN THE DRAWINGS

Figure 2:
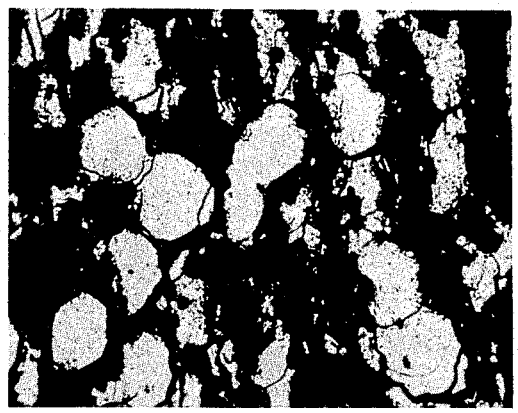
Figure 3:
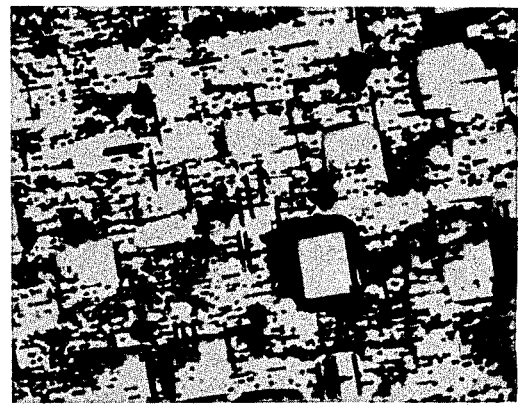
Figure 4:
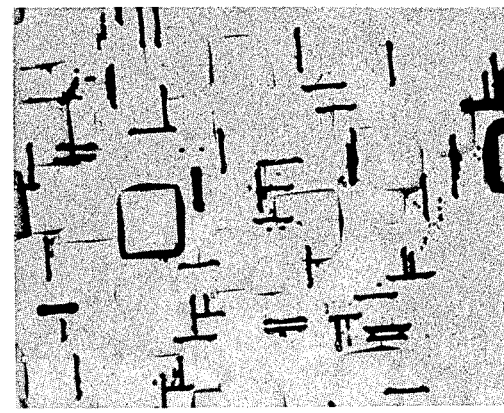

FIG. 1 is a diagrammatic longitudinal side view of an apparatus with a cylindrical carrier body for performing the novel process embodying the present invention; and FIGS. 2 to 4 are microphotographs illustrating Sirtl-etched silicon wafers which have been treated in various ways in an apparatus corresponding to FIG. 1.

Referring now in detail to the drawings and, in particular FIG. 1 thereof, the apparatus comprises a conveyor consisting of rollers 1, which is optionally provided with additional guide rollers 2. The conveyor serves to convey semiconductor wafers to be processed past a rotating cylinder 4, which is provided with an elastic carrier medium having abrasive grains bonded to it and which can be wetted with liquid from various nozzles 5. After contact with the cylinder, the wafers pass into a rinsing chamber 6 where they are cleaned with the aid of rinsing nozzles 7. The wafers are then dried in a drying chamber 8 by means of drying rollers 9 and a cold-air fan 10, and they are then available for further processing.

The semiconductor wafer to be processed can be placed on the conveyor, which, as shown for example in FIG. 1, consists of a plurality of rollers located one behind the other, either by hand or by machine using a suitable feeder. In this respect, accurate positioning of the semiconductor wafers, which are often susceptible to fracture, for example, by means of specific orientation of the wafer flat, has proved suitable since, in this manner, by orientating the preferred fracture directions of the wafer into a position in which they are subjected to a smaller degree of stress, the risk of fracture can be minimized.

The guidance of the semiconductor wafers located on the conveyor can be further improved, for example, by means of additional guide rollers which advantageously act from above. This is particularly recommended in that region of the conveyor in which the wafers are advanced, for the actual back-gettering surface treatment, to the cylinders provided for that purpose.

The surface of the cylinders is covered with an elastic material which is suitable as a carrier medium for the abrasive grain. The materials already mentioned are suitable for this purpose, for example, various types of rubber, non-woven fabrics or felts, as well as plastics or metal brushes. Cylinders provided with a covering of an abrasive non-woven material have proved especially suitable.

When a rubber covering is used as the carrier medium, the abrasive grain is advantageously embedded in the rubber; however, when non-woven materials or felts are used, the abrasive grain is advantageously fixed to the particular carrier medium by means of a suitable adhesive; while, when brushes are used, both methods are possible. The base materials used for the abrasive grain can, in principle, be any material which is as hard as or harder than the semiconductor wafers to be processed. Thus, in general, materials having a Mohs' hardness equal to or greater than 6 are suitable for the treatment of silicon wafers. Aluminum oxide and, expecially, silicon carbide have proved suitable when an abrasive non-woven material is used as the cylinder covering.

If an elastic carrier medium with fine abrasive grain is used on the cylinders, surface damage that induces stacking faults can especially be achieved, whereas coarse abrasive grains lead rather to dislocations. For example, when an abrasive non-woven material is used as the carrier medium and silicon carbide is used as the abrasive grain, a nominal grain size of from 3 to 10 $\mu$m, especially of from 5.5 to 7.5 $\mu$m, has proved suitable for the production of surface damage that induces stacking faults. The term nominal grain size is used here in the meaning of the FEPA classification for the standardization of abrasives; a nominal grain size of from 5.5 to 7.5 $\mu$m corresponds, for example, to the FEPA grain classification 800. Abrasive grain having a nominal grain size range of approximately 50 to 250 $\mu$m, especially of from 100 to 150 $\mu$m, can advantageously be used for surface damage that produces dislocations; accordingly, grain corresponding, for example, to the FEPA classification 100 is very suitable for that purpose. Nominal grain sizes in the range of approximately 10 to 50 $\mu$m such as, for example, the FEPA grain classification 500 (nominal grain size 11.8 to 13.8 $\mu$m) can be used advantageously for the simultaneous production of dislocations and stacking faults.

The rotational speed of the cylinders also influences the nature of the surface damage, it, of course, being always necessary to consider this parameter in conjunction with the diameter of the cylinder, since, as experience has shown, comparable results are obtained at a lower speed when using a cylinder of larger diameter than is necessary when using a cylinder of smaller diameter. In principle, however, a high speed will favor the production of dislocations and a low speed will favor the production of surface damage that induces stacking faults. In the case of a cylinder diameter of approximately 90 mm, particularly good results are to be expected, for example, with respect to stacking faults in the speed range from 400 to 600 rev/min, and with respect to dislocations in the speed range of from 2000 to 3500 rev/min.

The rate at which the semiconductor wafers are transported on the conveyor can also promote one or the other type of surface damage. In general, a higher transport speed has an advantageous effect in the case of stacking fault damage and a lower transport speed has an advantageous effect in the case of dislocation damage.

The force with which the cylinder presses on the semiconductor wafers to be processed is of little importance as a process parameter, since, as a result of the elasticity of the carrier medium, it is, in general, sufficient for the cylinder to be held in a position which ensures adequate contact with the semiconductor wafer to be processed. Thus, simply by means of suitable matching of the process parameters, which can be varied individually or in combination with one another—namely, size of abrasive grain, rotational speed of the cylinder, and transport speed of the wafers, the desired nature and concentration of surface damage can be achieved simply and easily. The process parameters can also be varied if a transition is made from semiconductor wafers of a certain crystallographic orientation, for example [100]—wafers, to wafers of a different crystallographic orientation, for example [111]—wafers.

Of course, the process according to the invention is not limited to the use of only a single cylinder; on the contrary, any desired number of cylinders can be connected one behind another. In this respect, it is advantageous to treat the wafers, not exclusively on the upper face, but also, in a corresponding manner, on the lower face, using one, or, if desired, several additional cylinders, since, for example, in the case of a subsequent one-sided polishing step, an oriented positioning of the wafers may be unnecessary.

It has also proved advantageous for the cylinders to execute, in addition to the rotational movement, an oscillating movement back and forth in an axial direction, as particularly uniform surface damage can be achieved in this manner. A marked improvement in the surface damage can be seen as a rule, even with an oscillation of a few millimeters, e.g., from 5 to 10 mm.

A further advantage of cylindrical carrier bodies is that they make it particularly simple to process several semiconductor wafers simultaneously side by side. With a cylinder width of approximately 600 mm, for example, at least 5 wafers each having a diameter of 100 mm can be treated in parallel. Thus, the high throughput rates which can be achieved in the present process can possibly be increased further by the use of wider cylinders.

It has also proved suitable to spray the cylinders with a liquid, preferably deionized water, during the processing operation. For this purpose, nozzles, from which the water can be applied to the cylinder, are advantageously located on each side of the cylinder. In principle, however, the spraying can be omitted.

It is advantageous for the actual damage treatment of the semiconductor wafers to be followed directly by a cleaning operation, e.g., by means of spraying with deionized water from rinsing nozzles advantageously located above and below the conveyor, and by a drying operation, e.g., by means of drying rollers in conjunction with a cold-air fan. The semiconductor wafers are then available for further processing.

The process according to the invention thus makes it possible to provide semiconductor wafers with controlled surface damage for back-gettering in a simple manner and at high throughput rates. Semiconductor materials suitable for this purpose are, especially, silicon, but also, for example, germanium or III/V compounds, such as, for example, gallium arsenide or gallium phosphide.

In the following examples, the process of the present invention will be more fully described, which are given by way of illustration and not of limitation.

EXAMPLE 1

In an apparatus corresponding to FIG. 1, 200 lapped and etched silicon wafers (diameter 100 mm, [111]—orientation) were placed by hand in groups of five on a conveyor consisting of a series of rollers, the flat of the wafers being arranged parallel to the feed direction. The wafers were moved, at a rate of 1 m/min, towards a cylinder having a width of 600 mm and a diameter of 90 mm.

The cylinder was covered with an abrasive nonwoven material with silicon carbide abrasive grain (FEPA 100, nominal grain size 105 to 149 $\mu$m), and it was rotated at 2100 rev/min, additionally executing a reciprocating movement in an axial direction at a rate of 90 times per minute and with an amplitude of 9 mm. During the operation, the cylinder was sprayed with deionized water.

The silicon wafers were passed under the rotating cylinder, coming into contact with the cylinder and receiving the desired surface damage. They were then cleaned by being sprayed with deionized water and were dried by drying rollers and a cold-air fan.

Then, after their untreated side had been polished in a customary manner, the wafers were subjected to oxidation for two hours at 1200° C. in moist oxygen. When the oxide had been dissolved off in hydrofluoric acid, the wafers were Sirtl-etched: the front of the wafers was shown to be free of the so-called "small pits" which indicate point defects. The rear of the wafer, shown in FIG. 2, shows a high concentration of dislocation etching pits.

EXAMPLE 2

The process was carried out as in Example 1, with the variations that the silicon wafers used were of [100]—orientation, that the cylinder carried silicon carbide abrasive grain of nominal grain size from 11.8 to 13.8 $\mu$m (FEPA 500), and that the cylinder was rotated at 1250 rev/min. When the wafers had been worked up as in Example 1 (oxidation at 1100° C., dissolution of the oxide, and Stirtl-etching), the front of the wafers was free of small pits. On the rear, as can be seen from FIG. 3, both stacking faults and dislocation etching pits were visible.

EXAMPLE 3

The process was carried out as in Example 2, with the variation that a cylinder with silicon carbide abrasive grain of nominal grain size from 5.5 to 7.5 $\mu$m (FEPA 800) was used at a rate of rotation of 300 rev/min. After oxidation, removal of the oxide and etching, as in Example 2, the front of the wafers was free of defects. As can be seen from FIG. 4, stacking faults were especially visible on the rear, in addition to a few dislocation etching pits.

EXAMPLE 4

30 silicon wafers were subjected directly, without damage treatment, to the polishing treatment described in Examples 1–3, followed by oxidation, removal of the oxide and Sirtl-etching. These wafers (not shown) clearly showed a high concentration of small pits.

Thus, while only one embodiment and several examples of the present invention has been shown and described, it is obvious that many changes and modifications may be made thereunto, without departing from the spirit and scope of the invention.

What is claimed is:

1. A process for the backside-gettering surface treatment of semiconductor wafers by means of mechanical stress, comprising the step of:
   linearly feeding the wafers on longitudinally-extending conveyor means in an unattached but supported condition, past at least one moving carrier body, the surface of which is provided with an elastic carrier medium to which an abrasive grain is bonded, so as to create mechanical stress and, in turn, rear-surface damage to said wafer having a rear-gettering effect.

2. The process of claim 1, wherein materials having a Shore A hardness of up to 90 are used as said carrier medium.

3. The process according to claims 1 or 2, wherein said moving carrier body is a cylinder which is rotated as said wafers are brought into contact therewith.

4. The process of claim 1, wherein abrasive grain having a nominal grain size of from 3 to 250 $\mu$m is used.

5. The process of claim 1, wherein wafers of silicon are used as said semiconductor wafers.

6. The process of claim 3, wherein said bringing step comprises feeding the semiconductor wafers on a conveyor past said cylinder.

7. The process according to claim 1, wherein said conveyor means comprises a set of upper and lower conveyors which convey said wafers thereinbetween.

8. The process according to claim 1, wherein said conveyor means comprises a plurality of successively-arranged, spaced apart rollers aligned in a row.

9. A process for the backside-gettering surface treatment of semiconductor wafers by means of mechanical stress, comprising the step of:

bringing the wafers, supported by, but unattached, to movable support means into contact with at least one rotating and oscillating carrier body, the surface of which is provided with an elastic carrier medium to which an abrasive grain is bonded so as to create mechanical stress and, in turn, rear-surface damage to said wafer having a rear gettering effect.

10. A process for the backside-gettering surface treatment of semiconductor wafers by means of mechanical stress, comprising the step of:

bringing the semiconductor wafers, supported by, but unattached, to movable support means, into contact with at least one moving carrier body, the surface of which is provided with an elastic carrier medium to which an abrasive grain is bonded so as to create mechanical stress, said carrier body moving at a speed effective for producing surface damage that induces dislocations in said semiconductor wafers.

11. A process for the backside-gettering surface treatment of semiconductor wafers by means of mechanical stress, comprising the step of:

bringing the semiconductor wafers, supported by, but unattached, to movable support means, into contact with at least one moving carrier body, the surface of which is provided with an elastic carrier medium to which an abrasive grain is bonded so as to create mechanical stress, said carrier body moving at a speed effective for producing surface damage that induces stacking faults in said semiconductor wafers.

12. A process for the backside-gettering surface treatment of semiconductor wafers by means of mechanical stress, comprising the step of:

conveying the semiconductor wafers, supported by, but unattached, to move support means, into contact with at least one moving carrier body, the surface of which is provided with an elastic carrier medium to which an abrasive grain is bonded so as create mechanical stress, the wafers being conveyed into contact with said carrier body at a speed effective for producing surface damage that induces stacking faults in said semiconductor wafers therein.

13. A process for the backside-gettering surface treatment of semiconductor wafers by means of mechanical stress, comprising the step of:

conveying the semiconductor wafers, supported by, but unattached, to movable support means, into contact with at least one moving carrier body, the surface of which is provided with an elastic carrier medium to which an abrasive grain is bonded so as to create mechanical stress, the wafer being conveyed into contact with said carrier body at a speed effective for producing surface damage that induces dislocations in said semiconductor wafers.

* * * * *